United States Patent [19]

Orton

[11] Patent Number: 5,331,512
[45] Date of Patent: Jul. 19, 1994

[54] SURFACE-MOUNT LED

[76] Inventor: Kevin R. Orton, 970 Calle Negocio, San Clemente, Calif. 92672

[21] Appl. No.: 869,798

[22] Filed: Apr. 16, 1992

[51] Int. Cl.$^5$ .............................................. H05K 7/02
[52] U.S. Cl. ..................................... 361/760; 361/772
[58] Field of Search ................. 362/800; 313/512; 361/398, 403, 400, 770, 767, 768, 772

[56] References Cited

U.S. PATENT DOCUMENTS 4,894,751  1/1990  Wehnelt ........................... 361/404 X

OTHER PUBLICATIONS

"Taping of Surface Mount Components for Automatic Placement" Electronic Industries Association—ANSI/EIA-481-A-1986 Catalog No. EB2-5 of Stanley Electric Co., Ltd.
"Surface Mount Land Patterns (Configurations and Design Rules)" ANSI/IPC-SM-782.

Primary Examiner—Eugene F. Desmond
Attorney, Agent, or Firm—Loyal M. Hanson

[57] ABSTRACT

A surface-mount LED device includes a base, an LED chip, and two terminal pads. The base has a first side, the LED chip occupies a position on the first side, and each of the two terminal pads is electrically connected to the LED chip. The two terminal pads occupy positions on the first side to enable surface-mounting on a circuitboard surface in a position such that the first side faces the circuitboard surface. A surface-mount LED carrier tape includes a carrier tape defining a plurality of spaced-apart component cavities for enabling automated placement of devices contained in the component cavities, at least one of the surface-mount LED devices in one of the component cavities, and a cover tape affixed to the carrier tape over the surface-mount LED device. The surface-mount LED device is disposed within one of the component cavities so that the first side of the base, the LED chip, and the terminal pads face the cover tape.

2 Claims, 2 Drawing Sheets

SURFACE-MOUNT LED

BACKGROUND OF THE INVENTION

1. Technical Field

This invention relates generally to electronic components, and more particularly to a surface-mount light-emitting diode (LED) device.

2. Background Information

Recall that a surface-mount component usually mounts entirely on one side of a printed circuitboard. It does not rely on wire leads that extend through holes to solder pads on the reverse side. Instead, it relies on small terminals that lie directly on circuitboard traces. A thin film of solder holds them in place. That arrangement promotes miniaturization and facilitates fabrication.

But certain problems arise with existing surface-mount LED components. Consider, for example, the task of designing a front panel for a radio-controlled (R/C) speed controller. The speed controller mounts onboard an R/C model racing car where it controls motor operation according to commands received via an onboard receiver. Its front panel enables an operator to specify various operating parameters. The front panel may include a miniature keypad for that purpose as well as an indicator in the form of an LED. In the interest of small size, a surface-mount LED component may be selected. But mounting problems accompany that selection.

A typical existing surface-mount LED component is tiny. It may include a 0.4 mm or so square LED chip mounted on the upperside of a 0.6 mm thick base that measures about 1.3 mm wide and 3.0 mm long. A 9.0 mm high lens covers the LED chip so that a viewer can discern emitted light when facing the upperside of the base. Electrically conductive traces on the base form two terminal pads on the underside for connection to traces on a circuitboard.

To mount the surface-mount LED on a circuitboard, one positions the base so that the underside faces the circuitboard. In that position, the two terminal pads on the underside sit atop two traces on the circuitboard. The upperside of the base faces away from the circuitboard toward the direction of a viewer. However, that position can be a problem when the circuitboard serves as the front panel of an R/C speed controller because the surface-mount LED component projects outwardly from the front panel toward the viewer. It occupies a vulnerable position. It also frustrates efforts to maintain a flat front panel appearance.

Surface-mounting the LED component on the reverse side of the circuitboard so that it spans a hole through the circuitboard does not work because the LED component emits light away from the surface on which it is mounted. So, it emits light rearwardly when back-mounted—away from the circuitboard and viewer instead of through the hole toward the viewer. Thus, existing surface-mount LEDs do not adapt well to the application described.

SUMMARY OF THE INVENTION

This invention alleviates the problem outlined above by providing a surface-mount LED device that has terminal pads arranged to enable upside down surface-mounting. In other words, the surface-mount LED device of this invention is arranged to enable mounting on a circuitboard in a position such that the LED chip is disposed toward the circuitboard. As a result, the device can be surface-mounted on the reverse side of a circuitboard in a position to emit light through a hole in the circuitboard.

Generally, a surface-mount LED device constructed according to the invention includes a base, an LED chip, and two terminal pads. Those elements may be similar in some respects to existing surface-mount LED components. The base has an upperside (more generally, a first side), the LED chip occupies a position on the first side, and each of the two terminal pads connects to the LED chip. According to a major aspect of the invention, however, each of the two terminal pads is located on the same side of the base as the LED chip (i.e., the first side of the base).

Electrically conductive material disposed on the base includes sufficient conductive material on the first side to form the two terminal pads in substantial compliance with surface-mount packaging standards. That arrangement enables surface-mounting in an upside down position such that the first side of the base faces the circuitboard. So, for front panel applications and so forth, the surface-mount device of this invention can be back-mounted to emit light through a hole in the circuitboard. Preferably, the conductive material extends to an underside of the base (an oppositely facing second side of the base) where it forms two additional terminal pads. They enable surface-mounting in the usual way—with the underside facing the circuitboard.

According to another aspect of the invention, there is provided a surface-mount LED carrier tape for automated component placement. The carrier tape is similar in many respects to existing carrier tapes. It defines a plurality of spaced-apart component cavities and includes a cover tape covering the cavities. However, at least one of the cavities contains a surface-mount LED device constructed according to the invention. It is so disposed within the component cavity that the first side of the base, the LED chip, and the terminal pads face opposite the cover tape. That positions the device for surface mounting with the LED chip facing the circuitboard.

The foregoing and other objects, features, and advantages of the invention will become more apparent upon reading the following detailed description with reference to the illustrative drawings.

DESCRIPTION OF THE PREFERRED EMBODIMENTS

Figure 1:
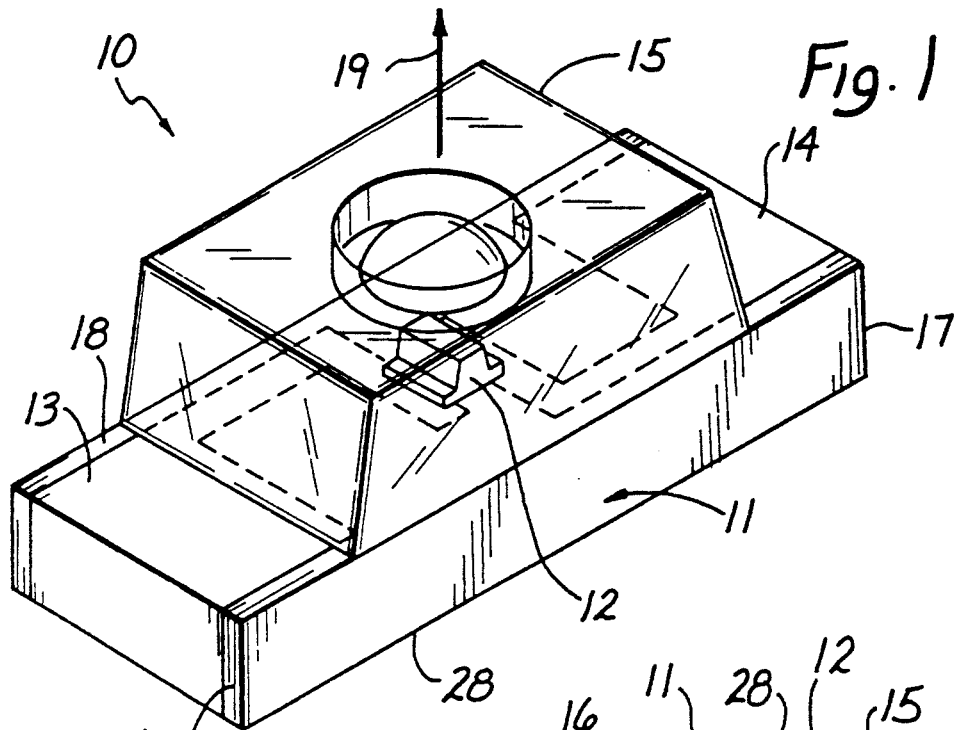
FIG. 1 of the drawings is a pictorial view of a surface-mount LED component constructed according to the invention.

FIGS. 1-5 show a surface-mount LED device 10 constructed according to the invention. Generally, it includes a base 11, and LED chip 12, and two terminal pads 13 and 14. Those elements may be fabricated and arranged in an assembly somewhat similar to existing surface-mount LED packages, such as the component designated Type No. BR1102 that is available from Stanley Electric Co., Ltd. of Tokyo, Japan. That and various other surface-mount components are described in Stanley Catalog No. EB 2-5.

Similar to existing components, the base 11 of the device 10 provides a support structure for the LED chip 12 and the terminal pads 13 and 14 to enable surface-mounting on a circuitboard. The base 11 also supports a lens 15 disposed over the LED chip 12 in the usual manner of many existing components. The lens may be suitably shaped and dimensioned to fit into a hole in a circuitboard as subsequently described with reference to FIG. 5. The base 11 may be composed of a suitable circuitboard material such as 0.6 millimeter thick glass epoxy circuitboard material. In addition, it may be shaped and dimensioned so that the device 10 has a standard package size in order to facilitate circuitboard design and automated assembly on the circuitboard. In that regard, the illustrated base 11 is approximately 3 millimeters long between first and second ends 16 and 17 and about 1.5 millimeters wide. Of course, those dimensions may vary according to the precise application.

According to a major aspect of the invention, the terminal pads 13 and 14 are arranged so that the device 10 can be mounted upside down in comparison to existing components. More specifically, the base 11 has a first side 18. It may be called an upperside in view of the orientation of the device 10 in FIG. 1. The LED chip 12 sits on the first side 18 so that it emits light perpendicularly away from the first side 18 through the lens 15 as depicted by an arrow 19 in FIG. 1. The terminal pads 13 and 14 are also disposed on the first side 18 and that arrangement enables surface-mounting of the device 10 on a circuitboard (such as a circuitboard 20 shown in FIG. 5) in a position such that the first side 18 faces the circuitboard 20.

Figure 5:
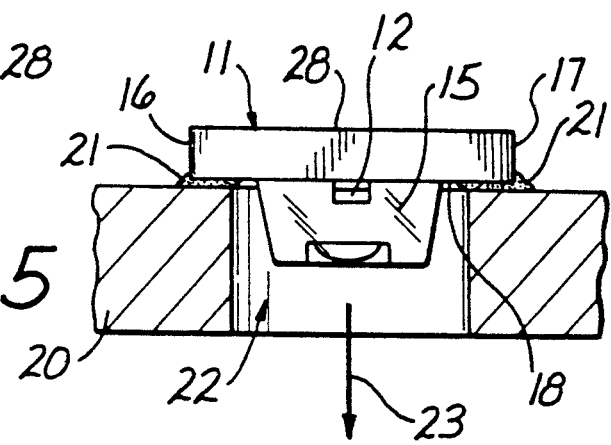
FIG. 5 is cross sectional view of a portion of a circuitboard on which the surface-mount LED component is mounted.
Figure 2:
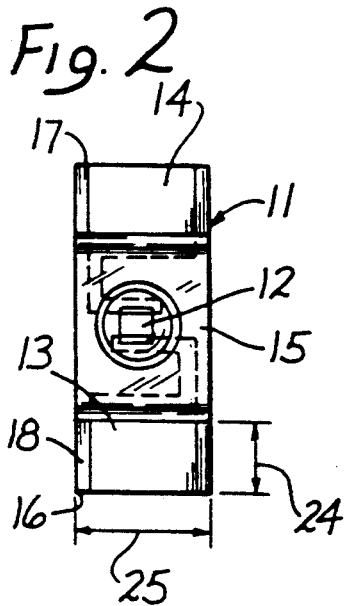
FIGS. 2-4 are, respectively, top, side, and bottom views of the surface-mount LED component.
Figure 3:
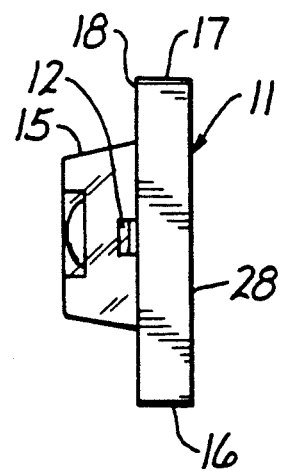
Figure 4:
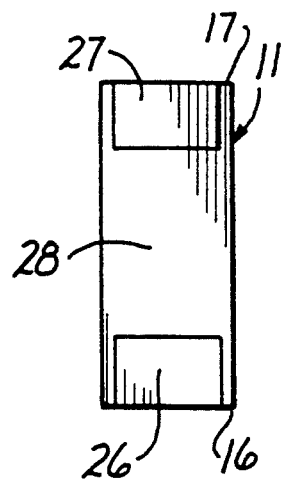

Thin films of solder 21 in FIG. 5 provide electrical and mechanical connection between the terminal pads 13 and 14 (FIG. 1) and conventional conductive traces (not shown) on the circuitboard 20 (FIG. 5). With the device 10 so mounted, the lens 15 extends into a hole 22 through the circuitboard 20 (FIG. 5) and the LED chip 12 emits light in the direction of an arrow 23. The illustrated circuitboard 20 forms the front panel of an R/C speed controller facing in the direction of the arrow 23 and the foregoing arrangement results in the device 10 being recessed to a position where it is less vulnerable and where it does not interfere with a flat front panel appearance. The circuitboard 20 may be piece of 0.0625 inch thick (1.59 mm) glass epoxy printed circuitboard stock. The size of the hole 22 is slightly exaggerated in FIG. 5 relative to the lens 15 for illustrative convenience, and the lens 15 may be configured with a cylindrical, dome, or frusto-conical shape to better mate the hole 23.

Considering the terminal pads 13 and 14 in further detail, they are dimensioned and arranged to substantial comply with accepted standards. In other words, the term "terminal pad" in the description and claims of this application means a conductive material that is shaped, dimensioned, and arranged in substantially compliance with recognized surface mount design standards. An example of such standards may be found in the publication entitled *Surface Mount Land Patterns* (Configurations and Design Rules). It is published by The Institute for Interconnecting and Packaging Electronic Circuits of Lincolnwood, Ill. The standards it contains have been approved by American National Standards Institute of New York, N.Y., and the publication bears the identifying designation ANSI/IPC-SM-782. A copy accompanies this application and it is incorporated herein by reference for the details provided.

Each of the terminal pads 13 and 14 is shaped and dimensioned accordingly to substantially comply with those standards. That causes them to mate with standard land pattern configurations. Of course, terminals pads within the inventive concepts disclosed may be otherwise configured to mate with other land pattern configurations.

The terminals pads 13 and 14 are generally similar, and so only the terminal pad 13 is described in further detail. It may, for example, be a silver-plated land pattern formed on the base 11. It is formed to have a length 24 (FIG. 2) of approximately 0.7 millimeters and a width 25 of approximately 1.3 millimeters. Of course, those dimensions may vary somewhat according to the size of the base 11. The essential feature is that the terminal pad 13 forms what is sometimes called a "top termination" (a termination on the same side of the base 11 as the LED 12) as opposed to what is sometimes called a "bottom-only termination" (a termination on the opposite side of the base 11).

Preferably, the device 10 includes two additional terminal pads 26 and 27 (FIG. 4) on a second side 28 of the base 11 (i.e., "bottom terminations"). They may be extension of the land pattern forming the terminal pads 13 and 14 and, in line with meaning previously assigned to the term "terminal pad," they are formed from a conductive material that is shaped, dimensioned, and arranged in substantial compliance with recognized surface mount design standards. For that purpose, the illustrated terminal pads 26 and 27 have the same dimensions as the terminal pads 13 and 14. They enable surface-mounting on a circuitboard in a position such that the second side 28 faces the circuitboard in the usual manner of existing components.

Figure 6:
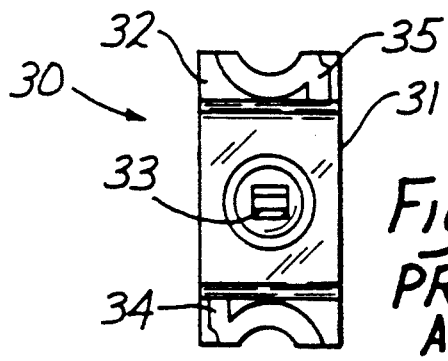
FIGS. 6 and 7 are top and bottom views of a surface-mount LED component constructed according to the prior art.
Figure 7:
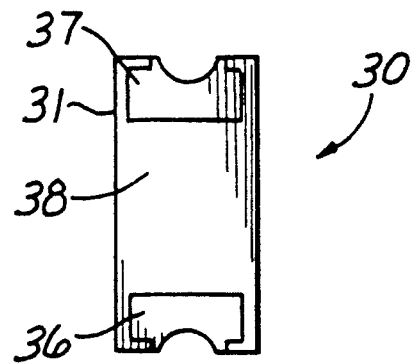

A typical existing surface-mount LED component 30 is shown in FIGS. 6 and 7. It includes a base 31 with a first side 32 on which is mounted an LED chip 33. Traces 34 and 35 (FIG. 6) electrically connect the LED chip 33 to two terminal pads 36 and 37 (FIG. 7) on a second side 38 of the base 31. The terminal pads 36 and 37 substantially comply with surface mount design standards, but the traces 34 and 35 do not. For one thing, the traces 34 and 35 do not have sufficient surface area. They simply are not designed or configured as terminal pads. In addition, one trace is often painted with a colored indicator to designate the cathode end of the component. Any such designation on the device 10 is not placed on the terminal pads as it would impair proper soldering.

Figure 8:
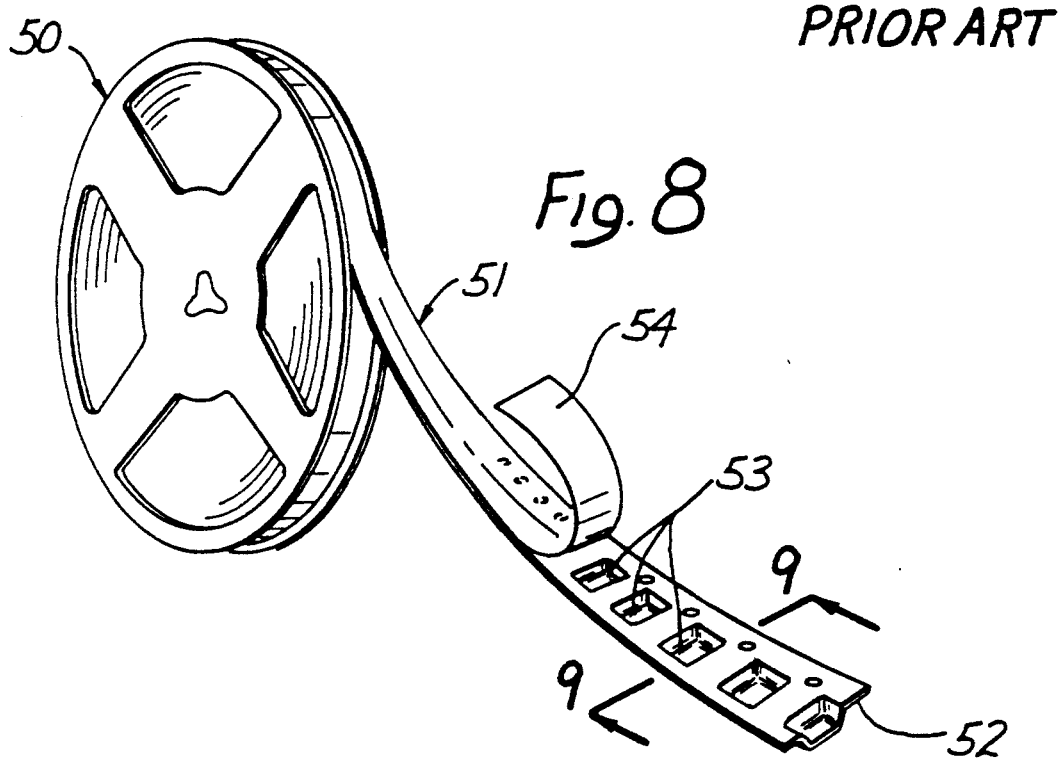
FIG. 8 is a pictorial of a reel of carrier tape containing surface-mount LED devices constructed according to the invention.

Considering now FIG. 8, it shows a reel 50 of loaded carrier tape 51 holding a number of the surface-mount LED devices 10 for automated placement. The loaded carrier tape 51 includes an embossed carrier tape 52 that defines a plurality of spaced-apart component cavities such as the cavities 53. A cover tape 54 affixed to the embossed carrier tape 52 covers the cavities 53 to hold the surface-mount LED devices 10 within. The loaded carrier tape 51 feeds through a known type of automatic component placement machine (not shown). It removes the devices 10 from the component cavities 53 and places them in desired position on a circuitboard.

The embossed carrier tape 52 and cover tape 51 may be similar in many respects to existing carrier tape designs. Various details are set forth in the publication of Electronic Industries Association entitled *Taping of Surface Mount Components for Automatic Placement*. That publication is identified with American National Standards designation ANSI/EIA-481-A-1986, and a copy accompanies this application. It is incorporated by reference for the details provided. The size and shape of the cavities may vary from those shown in that publications so long as they are suitably arranged to receive the surface-mount devices 10.

Figure 9:
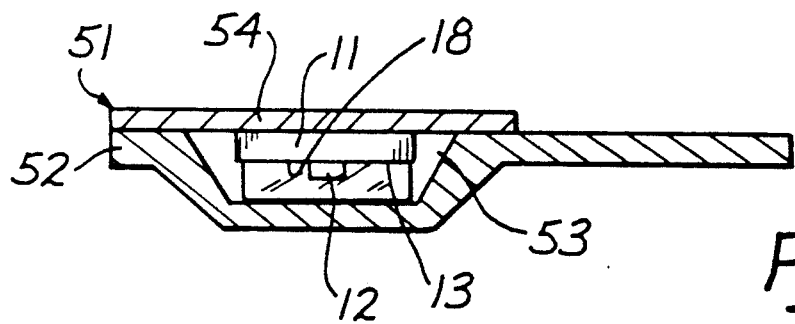
FIG. 9 is an enlarged cross sectional view of the carrier tape showing the position of a surface-mount LED device within one of the component cavities.

Some of the component cavities 53 in FIG. 8 are shown without devices 10 and the cover tape 57 is rolled back from them for illustrative clarity. The other component cavities in the loaded carrier tape 51 contain surface-mount LED devices 10, however. Before the cover tape 54 is rolled back and the device 10 removed, the empty component cavities 53 appear as shown in FIG. 9. It is a cross sectional view taken on line 9—9 of FIG. 8.

The base 11 occupies a bottom portion of the cavity 53 with its upperside (i.e., first side 18) facing opposite the cover tape 54 toward the carrier tape. In that position, the LED chip 12 and the two terminal pads also face the cover tape. Just the terminal pad 13 is designated in FIG. 9. With the device 10 so disposed within the component cavity 53, it is positioned for removal by existing automatic equipment for placement on a circuitboard with the upperside 18, LED chip 12 and terminal pads facing the circuitboard.

Thus, the invention provides a surface-mount LED device that has terminal pads arranged to enable upside down surface-mounting (i.e., LED disposed toward the circuitboard). As a result, the device can be surface-mounted on the reverse side of a circuitboard in a position to emit light through a hole in the circuitboard. The loaded carrier tape described holds the devices for placement with existing automatic equipment.

Although an exemplary embodiment has been shown and described, many changes, modifications, and substitutions may be made by one having ordinary skill in the art without necessarily departing from the spirit and scope of the invention.

What is claimed is:

1. An R/C controller front panel assembly, comprising:
   a circuitboard having a front side, a reverse side, and a hole extending through the circuitboard from the front side to the reverse side; and
   a surface-mount LED device mounted on the circuitboard;
   the surface-mount LED device including a base, an LED chip on a first side of the base, and two terminal pads disposed on the first side of the base; and
   the surface-mount LED device being surface-mounted on the reverse side of the circuitboard in a position such that the base spans the hole and the first side of the base faces the reverse side of the circuitboard.

2. A panel assembly, comprising:
   a circuitboard having a front side, a reverse side, and a hole extending through the circuitboard from the front side to the reverse side; and
   a surface-mount LED device mounted on the circuitboard;
   the surface-mount LED device including a base, an LED chip on a first side of the base, and two terminal pads disposed on the first side of the base; and
   the surface-mount LED device being surface-mounted on the reverse side of the circuitboard in a position such that the base spans the hole and the first side of the base faces the reverse side of the circuitboard.

* * * * *